(12) United States Patent
Watanabe et al.

(10) Patent No.: US 7,321,249 B2
(45) Date of Patent: Jan. 22, 2008

(54) OSCILLATOR, FREQUENCY MULTIPLIER, AND TEST APPARATUS

(75) Inventors: Daisuke Watanabe, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/441,796

(22) Filed: May 26, 2006

(65) Prior Publication Data

US 2006/0261903 A1    Nov. 23, 2006

Related U.S. Application Data

(63) Continuation of application No. PCT/JP2004/017554, filed on Nov. 26, 2004.

(30) Foreign Application Priority Data

Nov. 28, 2003    (JP)    ............................. 2003-399603

(51) Int. Cl.
*H03K 3/00*    (2006.01)
(52) U.S. Cl. ........................ 327/251; 331/45
(58) Field of Classification Search ................ 331/45; 327/251

See application file for complete search history.

(56) References Cited

U.S. PATENT DOCUMENTS

| | | | |
|---|---|---|---|
| 6,570,425 B2 * | 5/2003 | Yamaguchi | ................. 327/251 |
| 6,970,047 B1 * | 11/2005 | Johnson et al. | ................. 331/45 |
| 2003/0137333 A1 | 7/2003 | Kozaki | |

FOREIGN PATENT DOCUMENTS

| | | |
|---|---|---|
| JP | 5-273308 | 10/1993 |
| JP | 11-52029 | 2/1999 |
| JP | 11-163689 | 6/1999 |

OTHER PUBLICATIONS

International Search Report issued for International application No. PCT/JP2004/017554 mailed on Mar. 1, 2005 and English translation thereof, 4 pages.

* cited by examiner

*Primary Examiner*—Joseph Chang
(74) *Attorney, Agent, or Firm*—Osha Liang LLP (57) ABSTRACT

There is provided an oscillator for generating an oscillating signal having desired frequency, having a reference oscillating section for generating a reference signal having predetermined frequency, a plurality of first variable delay circuits, connected in cascade, for receiving the reference signal and outputting the received reference signal by sequentially delaying by almost equal values of delay, a phase comparing section for comparing phase of the reference signal generated by the reference oscillating section with phase of a delay signal outputted out of a final stage of the plurality of first variable delay circuits, a delay control section for controlling a value of delay of the plurality of first variable delay circuits so that the phase of the reference signal becomes almost equal to the phase of the delay signal outputted out of the final stage of the plurality of first variable delay circuits and a frequency adding circuit for generating the oscillating signal in which edges of the respective input signals are combined by logically operating the input signals inputted to the respective first variable delay circuits.

25 Claims, 7 Drawing Sheets

OSCILLATOR, FREQUENCY MULTIPLIER, AND TEST APPARATUS

CROSS REFERENCE TO RELATED APPLICATION

This is a continuation application of PCT/JP2004/017554 filed on Nov. 26, 2004 which claims priority from a Japanese Patent Application(s) No. 2003-399603, filed on Nov. 28, 2003, the contents of which are incorporated herein by reference.

BACKGROUND OF THE INVENTION

1. Field of the Invention

The present invention relates to an oscillator for generating oscillation clock having desired frequency, a frequency multiplier for multiplying frequency of a given reference signal and a test apparatus for testing an electronic device.

2. Related Art

Frequency of carrier waves and clock signals for use in high-speed telecommunications for example is being remarkably increased lately. It is then necessary to reduce spurious and phase noise caused in the signal in order to guarantee high-precision operation using such high-frequency signal. Conventionally, such high-frequency signal has been generated by means of a PLL (Phase Lock Loop).

However, while the PLL generates the high-frequency signal by means of a voltage controlled oscillator (VCO), high technology and a number of times of trial design are essential in order to improve a Q-value of the VCO and its development cost becomes high. Still more, because the PLL is highly sensitive to noise, it is liable to be influenced by inner-chip noise and substrate coupling noise and it is difficult to isolate it from such noises.

It is also difficult to design the VCO having a high Q-value in average due to dispersion among elements in implementing the PLL on chip. When a LC tank circuit method is used in the VCO, an area where inductive elements and capacitive elements are disposed becomes extremely large, pressing an area to be used for other circuits such as a logic circuit.

SUMMARY OF THE INVENTION

Accordingly, it is an object of the invention to provide an oscillator, a frequency multiplier and a test apparatus, capable of solving the above-mentioned problems. This object may be achieved through the combination of features described in independent claims of the invention. Dependent claims thereof specify preferable embodiments of the invention.

In order to solve the above-mentioned problems, according to a first aspect of the invention, there is provided an oscillator for generating an oscillating signal having desired frequency, having a reference oscillating section for generating a reference signal having predetermined frequency, a plurality of first variable delay circuits, connected in cascade, for receiving the reference signal and outputting the received reference signal by sequentially delaying by almost equal values of delay, a phase comparing section for comparing phase of the reference signal generated by the reference oscillating section with phase of a delay signal outputted out of a final stage of the plurality of first variable delay circuits, a delay control section for controlling a value of delay of the plurality of first variable delay circuits so that the phase of the reference signal becomes almost equal to the phase of the delay signal outputted out of the final stage of the plurality of first variable delay circuits and a frequency adding circuit for generating the oscillating signal in which edges of the respective input signals are combined by logically operating the input signals inputted to the respective first variable delay circuits.

The oscillator may generate the oscillating signal having frequency of k times (where k is an integer of 2 or more) of frequency of the reference signal, 2k of the first variable delay circuits may be connected in cascade and may be provided with a value of delay almost equal to ½k times of period of the reference signal and the frequency adding circuit may generate rising and falling edges of the oscillating signal based on rising edges of the input signals inputted respectively to the plurality of first variable delay circuits.

The oscillator may further include a selecting section for selecting a plurality of input signals whose phase interval is almost equal among the plurality of input signals inputted to the plurality of first variable delay circuits and for supplying the selected input signals to the frequency adding circuit to generate the oscillating signal having frequency corresponding to the phase interval. The oscillator may also include a selecting section for selecting a plurality of arbitrary input signals among the plurality of input signals outputted out of the plurality of first variable delay circuits and supplying the selected input signals to the frequency adding circuit to generate the oscillating signal having an arbitrary pattern.

The oscillator may further include a filter for removing spurious components caused by skew of the plurality of input signals from a frequency component of the oscillating signal generated by the frequency adding circuit. The oscillator may further include a plurality of second variable delay circuits, connected in cascade, for receiving the delay signal outputted out of the final stage of the plurality of first variable delay circuits and outputting the received delay signal by sequentially delaying by almost equal values of delay with the first variable delay circuits and a plurality of voltage adding circuits, provided per each stage of the plurality of first and second variable delay circuits, for adding voltage level of the input signals inputted respectively to the first and second variable delay circuits provided in the same stage in the plurality of first and second variable delay circuits and for supplying them to the frequency adding circuit.

The frequency adding circuit may have a plurality of H-level generating sections, provided in correspondence to the first variable delay circuits provided in even numbered stages among the plurality of first variable delay circuits, for generating portions presenting H level in a waveform of the oscillating signal and a plurality of L-level generating sections, provided in correspondence to the first variable delay circuits provided in odd numbered stages among the plurality of first variable delay circuits, for generating portions presenting L level in the waveform of the oscillating signal, each of the H-level generating sections operates AND of the input signal inputted to the corresponding first variable delay circuit and an input signal delayed from the input signal by a time in which a value of delay of a portion of the first variable delay circuit is added with a half period of the reference signal and outputs voltage of H level of the oscillating signal when the calculated AND presents logic H, each of the L-level generating sections operates AND of the input signal inputted to the corresponding second variable delay circuit and an input signal delayed from the input signal by a time in which a value of delay of a portion of the first variable delay circuit is added to the half period of the reference signal and outputs voltage of L level of the oscillating signal when the calculated AND presents the logic H and the frequency adding circuit may output a sum of signals outputted out of the plurality of H-level generating sections and the plurality of L-level generating section as the oscillating signal. The reference oscillating section may be a quartz oscillator.

According to a second aspect of the invention, there is provided a frequency multiplier for outputting an oscillating signal in which frequency of a given reference signal is multiplied, having a plurality of first variable delay circuits connected in cascade for receiving the reference signal and outputting the received reference signal by sequentially delaying with almost equal values of delay, a phase comparing section for comparing phase of the reference signal generated by the reference oscillating section with phase of a delay signal outputted out of a final stage of the plurality of first variable delay circuits, a delay control section for controlling the value of delay of the plurality of first variable delay circuits so that the phase of the reference signal is almost equalized with the phase of the delay signal outputted out of the final stage of the plurality of first variable delay circuits and a frequency adding circuit for generating the oscillating signal in which edges of the respective input signals are combined by logically operating the input signals inputted to the respective first variable delay circuits.

According to a third aspect of the invention, there is provided a test apparatus for testing an electronic device, having a pattern generator for generating a test pattern for testing the electronic device, a waveform shaper for shaping and supplying the test pattern to the electronic device, a timing generator for generating a clock signal having desired frequency for controlling timing of the waveform shaper for supplying the test pattern, and a judging section for comparing an output signal outputted out of the electronic device with an expected value signal based on the test pattern to judge whether or not the electronic device is defect-free, and the timing generator has a reference oscillating section for generating a reference signal having predetermined frequency, a plurality of first variable delay circuits connected in cascade for receiving the reference signal and outputting the received reference signal by sequentially delaying with almost equal values of delay, a phase comparing section for comparing phase of the reference signal generated by the reference oscillating section with phase of a delay signal outputted out of a final stage of the plurality of first variable delay circuits, a delay control section for controlling the value of delay of the plurality of first variable delay circuits so that the phase of the reference signal is almost equalized with the phase of the delay signal outputted out of the final stage of the plurality of first variable delay circuits, and a frequency adding circuit for generating the clock signal in which edges of the respective input signals are combined by logically operating the input signals inputted to the respective first variable delay circuits.

It is noted that the summary of the invention described above does not necessarily describe all necessary features of the invention. The invention may also be a sub-combination of the features described above.

The invention allows the oscillating signal having less noise to be readily generated.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
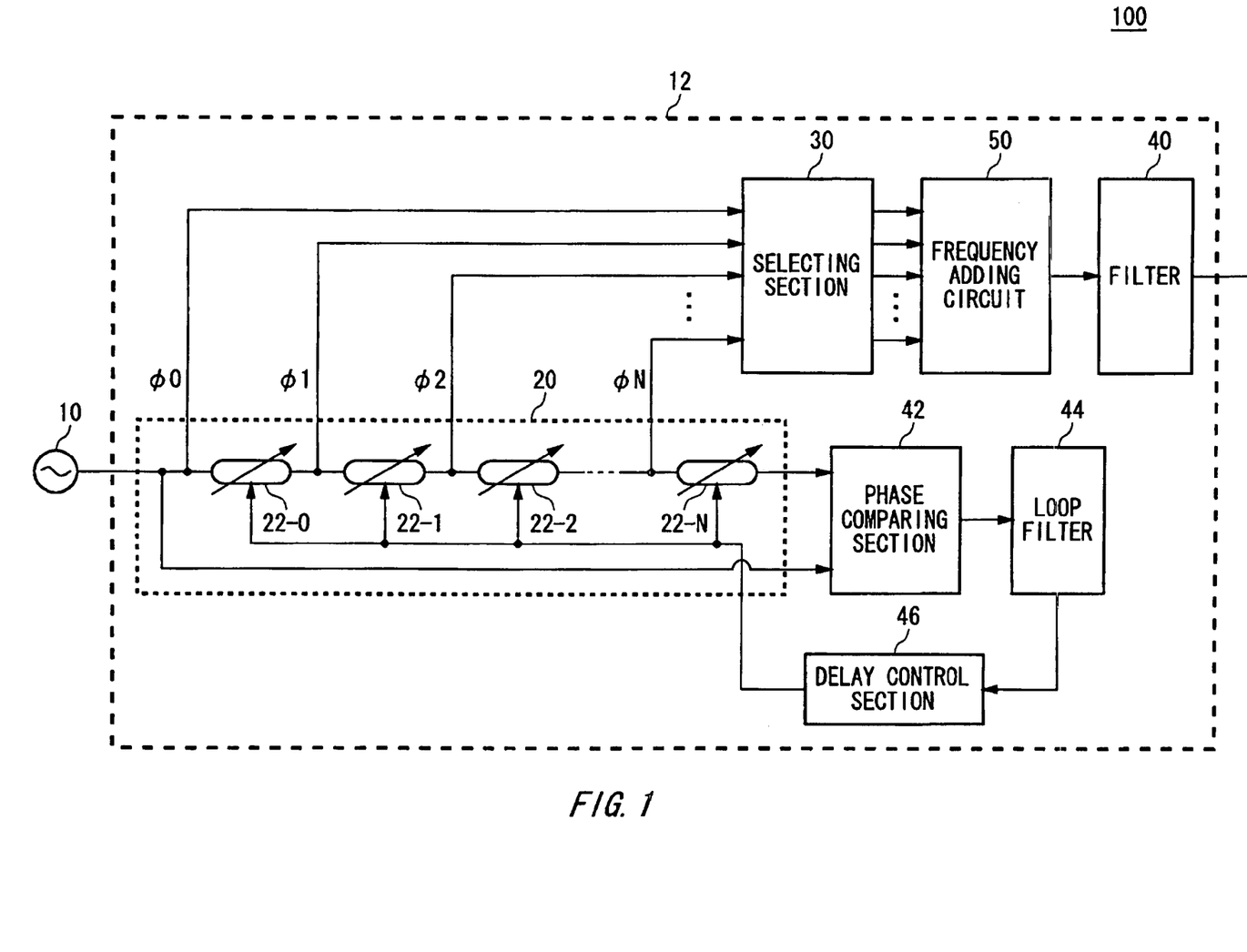
FIG. 1 is a diagram showing one exemplary configuration of an oscillator 100 according to an embodiment of the invention.

FIG. 1 is a diagram showing one exemplary configuration of an oscillator 100 according to an embodiment of the invention. The oscillator 100 of this example generates an oscillating signal having desired frequency by using a DLL (Delay Lock Loop). The oscillator 100 has a reference oscillating section 10 and a frequency multiplier 12. The reference oscillating section 10 generates a reference signal having predetermined frequency. The reference oscillating section 10 may be a quartz oscillator for example.

The frequency multiplier 12 outputs an oscillating signal in which the frequency of the given reference signal is multiplied. The frequency multiplier 12 has a delaying section 20, a selecting section 30, a filter 40, a phase comparing section 42, a loop filter 44, a delay control section 46 and a frequency adding circuit 50.

The delaying section 20 has a plurality of first variable delay circuits 22-0 through 22-N (denoted generally as 22 hereinafter) connected in cascade. The plurality of first variable delay circuits 22 receives the reference signal and outputs the received reference signal by delaying by almost equal values of delay, respectively.

The phase comparing section 42 compares phase of the reference signal generated by the reference oscillating section 10 with phase of a delay signal outputted out of a final stage of the plurality of variable delay circuits 22 and outputs voltage corresponding to their phase difference to the delay control section 46 via the loop filter 44.

Based on the voltage received from the phase comparing section 42, the delay control section 46 controls the value of delay of the plurality of first variable delay circuits 22. At this time, the delay control section 46 controls the value of delay of the respective first variable delay circuits so that the phase of the reference signal is almost equalized with the phase of the delay signal outputted out of the final stage of the plurality of first variable delay circuits and so that the value of delay in each of the first variable delay circuits 22 is equalized.

Figure 2:
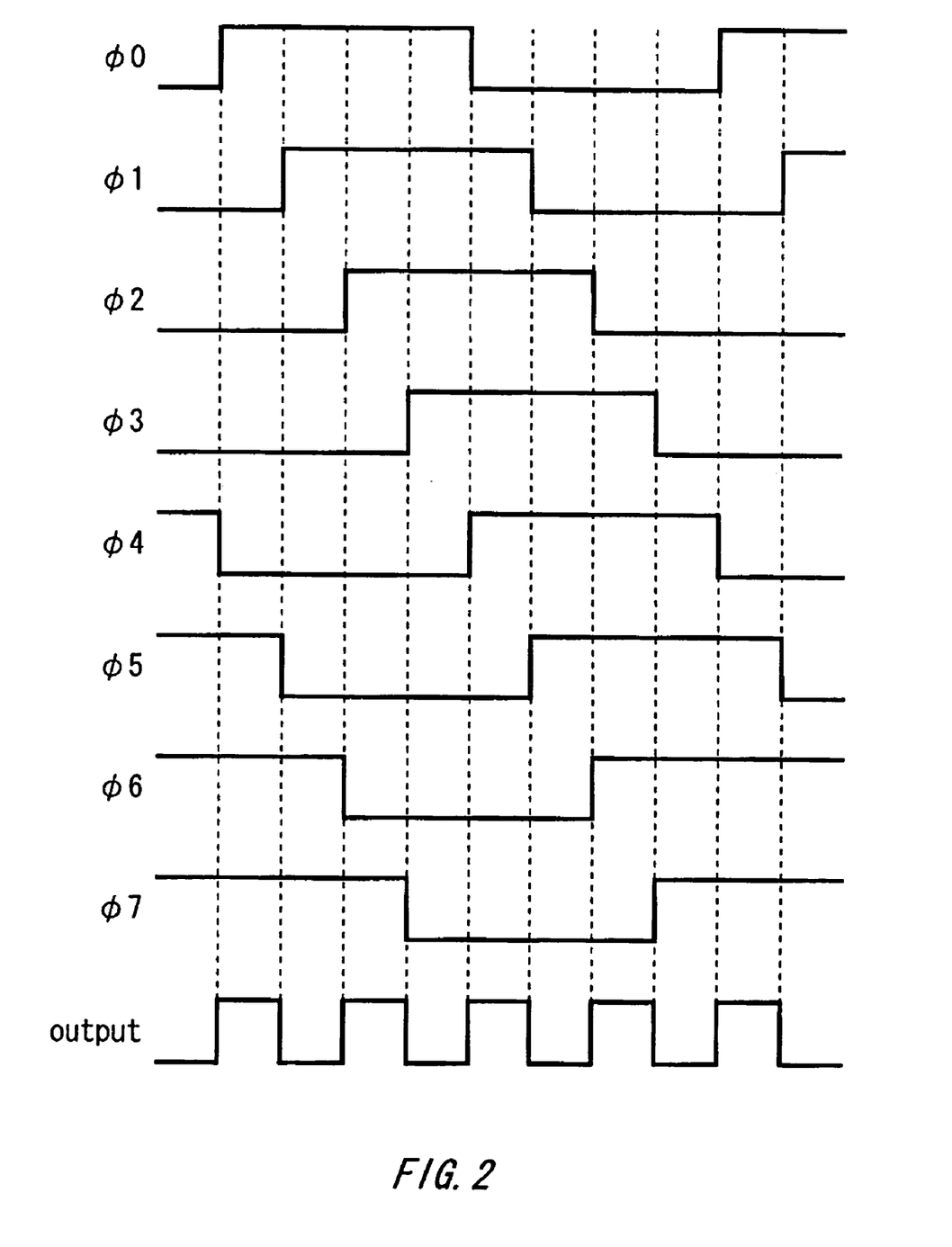
FIG. 2 is a timing chart showing one exemplary operation of the oscillator 100.

That is, input signals $\phi 0$ through $\phi N$ whose phase is shifted by a certain value each as shown in FIG. 2 are inputted to the respective first variable delay circuits 22. The frequency adding circuit 50 generates an oscillating signal in which edges of the respective input signals are combined by logically operating the input signals $\phi 0$ through $\phi N$ inputted to the respective first variable delay circuits 22. The frequency adding circuit 50 of this embodiment generates rising and falling edges of the oscillating signal based on rising and falling edges of the respective input signals.

When an oscillating signal having frequency of k times (where, k is an integer of 2 or more) of the frequency of the reference signal is to be generated for example, preferably 2k of first variable delay circuits 22 are connected in cascade. In this case, the delay control section 46 sets the value of delay of the first variable delay circuits 22-0 through 22-2k connected in cascade by 2k at value of delay almost equal to ½k times of period of the reference signal. It is then possible to generate the plurality of input signals φ0 through φ2 k−1 that present the respective rising and falling edges of the oscillating signal to be generated by setting the value of delays of the respective first variable delay circuits 22-0 through 22(2 k−1) as described above. The frequency adding circuit 50 generates the rising and falling edges of the oscillating signal based on the rising edges of the respective input signals φ0 through φ2 k−1 inputted to the plurality of first variable delay circuits 22-0 through 22-(2 k−1). A configuration of the frequency adding circuit 50 will be described later in connection with FIG. 3.

The selecting section 30 selects the plurality of input signals whose phase interval is almost equal from the plurality of input signals φ0 through φ2 k−1 corresponding to the frequency of the oscillating signal to be generated and supplies the selected input signals to the frequency adding circuit 50. Such control allows the oscillating signal having the frequency corresponding to the phase interval to be generated. For example, the selecting section 30 may generate the oscillating signal having frequency of k/2 times of the frequency of the reference signal by selecting the input signals φ2 m−1 inputted to every two stages of the plurality of first variable delay circuits 22-(2 m−1) (where m is an integer from 0 through k). That is, the selecting section 30 may generate the oscillating signal having the frequency of k through k/2 j (where j is an integer) of the frequency of the reference signal by selecting the input signals inputted to every 2 j stages of the plurality of first variable delay circuits 22. The selecting section 30 may generate an oscillating signal having an arbitrary pattern by selecting a plurality of arbitrary input signals. A configuration of the selecting section 30 will be described later in connection with FIG. 4.

The filter 40 removes spurious components generated by skew of the plurality of input signals from the frequency component of the oscillating signal generated by the frequency adding circuit 50. Because the oscillator 100 of the present embodiment uses the DLL (Delay Lock Loop), a Q-value of the oscillating signal becomes almost equal to a Q-value of the reference signal and the Q-value of the oscillating signal may be improved as compared to a case of using a VCO. Still more, because the spurious components caused in the oscillating signal are generated discretely from a center frequency band corresponding to the value of delays of the first variable delay circuits 22, they may be readily removed by the filter 40 having a low Q-value and a simple configuration.

FIG. 2 is a timing chart showing one exemplary operation of the oscillator 100. In this example, the oscillator 100 generates the oscillating signal (output) having frequency of four times of the frequency of the reference signal. The value of delay almost equal to ⅛ of the period of the reference signal is set for the respective first variable delay circuits 22 as described above. Then, among the respective input signals φ0 through φ7, the frequency adding circuit 50 generates the rising edges of the oscillating signal from the rising edges of the even numbered input signals (φ0, φ2, φ4, φ6) and generates the falling edges of the oscillating signal from the rising edges of the odd numbered input signals (φ1, φ3, φ5, φ7).

Figure 3:
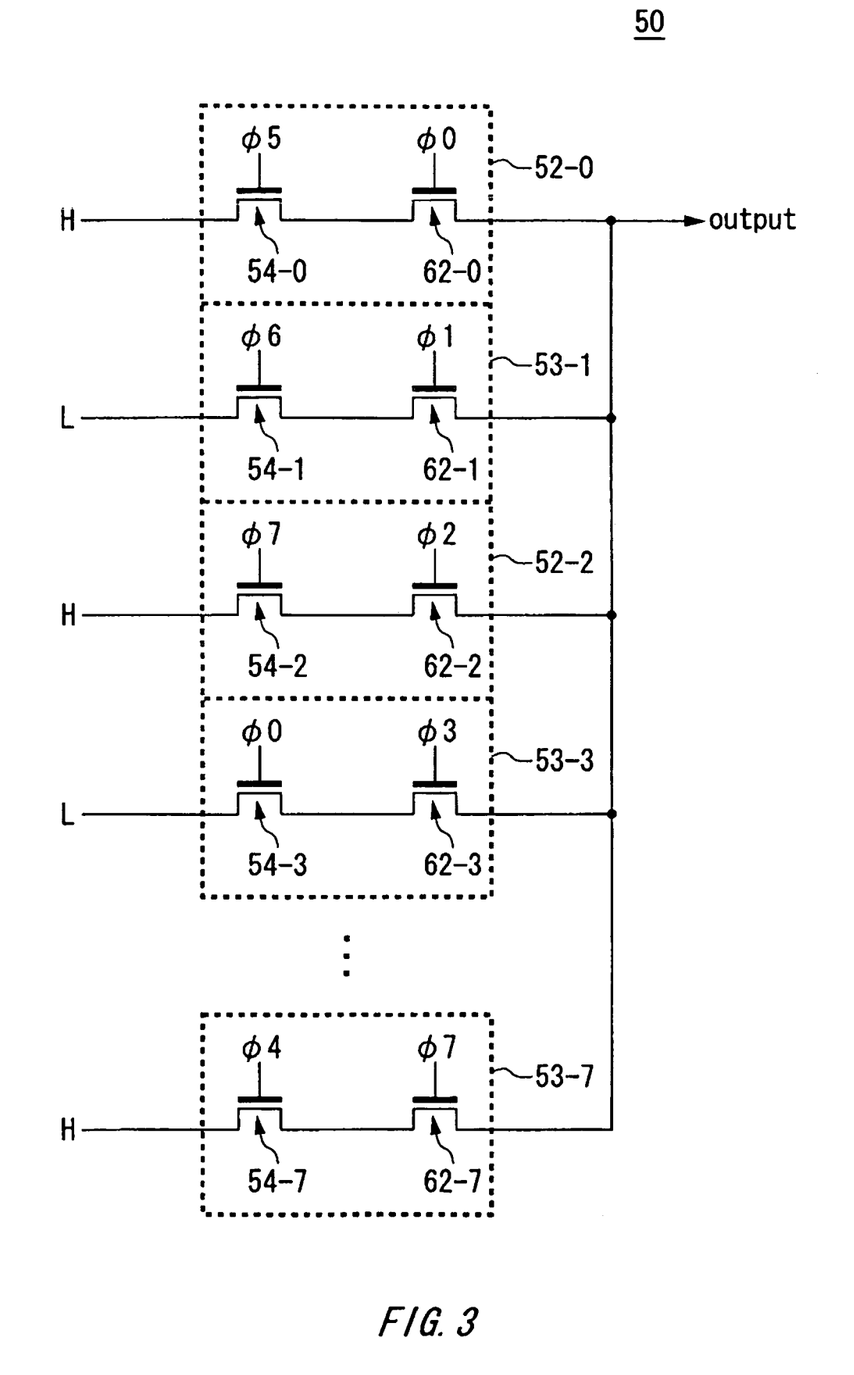
FIG. 3 is a diagram showing one exemplary configuration of a frequency adding circuit 50.

FIG. 3 is a diagram showing one exemplary configuration of the frequency adding circuit 50. In this example, the frequency adding circuit 50 has a plurality of H-level generating sections 52-0, 52-2, . . . (denoted generally as 52 hereinafter) and a plurality of L-level generating sections 53-1, 53-3, . . . (denoted generally as 53 hereinafter).

The plurality of H-level generating sections 52 is provided in correspondence to the first variable delay circuits 22-0, 22-2, 22-4, . . . provided in the even numbered stages among the plurality of first variable delay circuits 22 and generates portions presenting H level (crest portions) in a waveform of the oscillating signal. Each of the H-level generating sections 52 operates at least AND of the input signal inputted to the corresponding first variable delay circuit 22 and an input signal delayed from the input signal by a time in which a value of delay of a portion of the first variable delay circuit is added with a half period of the reference signal and outputs voltage of the H level of the oscillating signal when the calculated AND presents the logic H.

For example, the H-level generating section 52-0 operates AND of the corresponding input signal φ0 and the input signal φ5 delayed from the input signal φ0 by a time in which the value of delay of the portion of the first variable delay circuit is added with the half period of the reference signal. Here, although no delayed input signal exists with respect to the input signal inputted in the final stage of the first variable delay circuits for example, the H-level generating section 52 operates AND of an input signal delayed from the input signal by a time in which the value of delay of a portion of the first variable delay circuit is added with the half period of the reference signal when the input signal is shifted forward by one period in such a case. That is, an input signal delayed from the input signal by the time in which the value of delay of a portion of the first variable delay circuit is added with the half period of the reference signal includes an input signal whose phase is delayed from the input signal by a time in which the value of delay of one portion of the first variable delay circuit is added with the half period of the reference signal and an input signal whose phase is in advance from the input signal by a time in which the value of delay of a portion of the first variable delay circuit is subtracted from the half period of the reference signal.

In this example, the H-level generating section 52 has a plurality of transistors 54 and 62. The corresponding input signal is given to the transistor 62 via a gate terminal and an input signal delayed from the input signal by the time in which the value of delay of a portion of the first variable delay circuit is added with the half period of the reference signal is given to the transistor 54 via its gate terminal. The respective transistors are connected in cascade and H level voltage is given to a source terminal of the transistor 54. The H-level generating section 52 generates the voltage of the H level of the oscillating signal when AND of the given input signals is logic H through such configuration.

The plurality of L-level generating section 53 is provided in correspondence to the first variable delay circuits 22-1, 22-3, 22-5, . . . provided in odd numbered stages among the plurality of first variable delay circuits 22 and generates portions presenting L level (trough portions) of the waveform of the oscillating signal. Each of the H-level generating sections 52 operates at least AND of the input signal inputted to the corresponding first variable delay circuit 22 and an input signal delayed from the input signal by the time in which the value of delay of a portion of the first variable delay circuit is added with the half period of the reference signal and outputs voltage of the H level of the oscillating signal when the calculated AND presents the logic H.

Although the L-level generating section 53 has almost the same configuration with the H-level generating section 52 described above, the voltage of L level of the oscillating signal is given to the transistor 54 of the L-level generating section 53. Then, the frequency adding circuit 50 outputs a sum of signals outputted out of the plurality of H-level generating sections 52 and the plurality of L-level generating sections 53 as the oscillating signal. Through such configuration, only either one of ANDs calculated by the plurality of H-level generating sections 52 and the plurality of L-level generating sections 53 becomes logic H in each phase of the oscillating signal and a value of the oscillating signal in the phase is determined by voltage level given to the H-level generating sections 52 or the L-level generating sections 53 that have calculated the logic H. The frequency adding circuit 50 of this embodiment allows the oscillating signal to be generated by the simple configuration.

Figure 4:
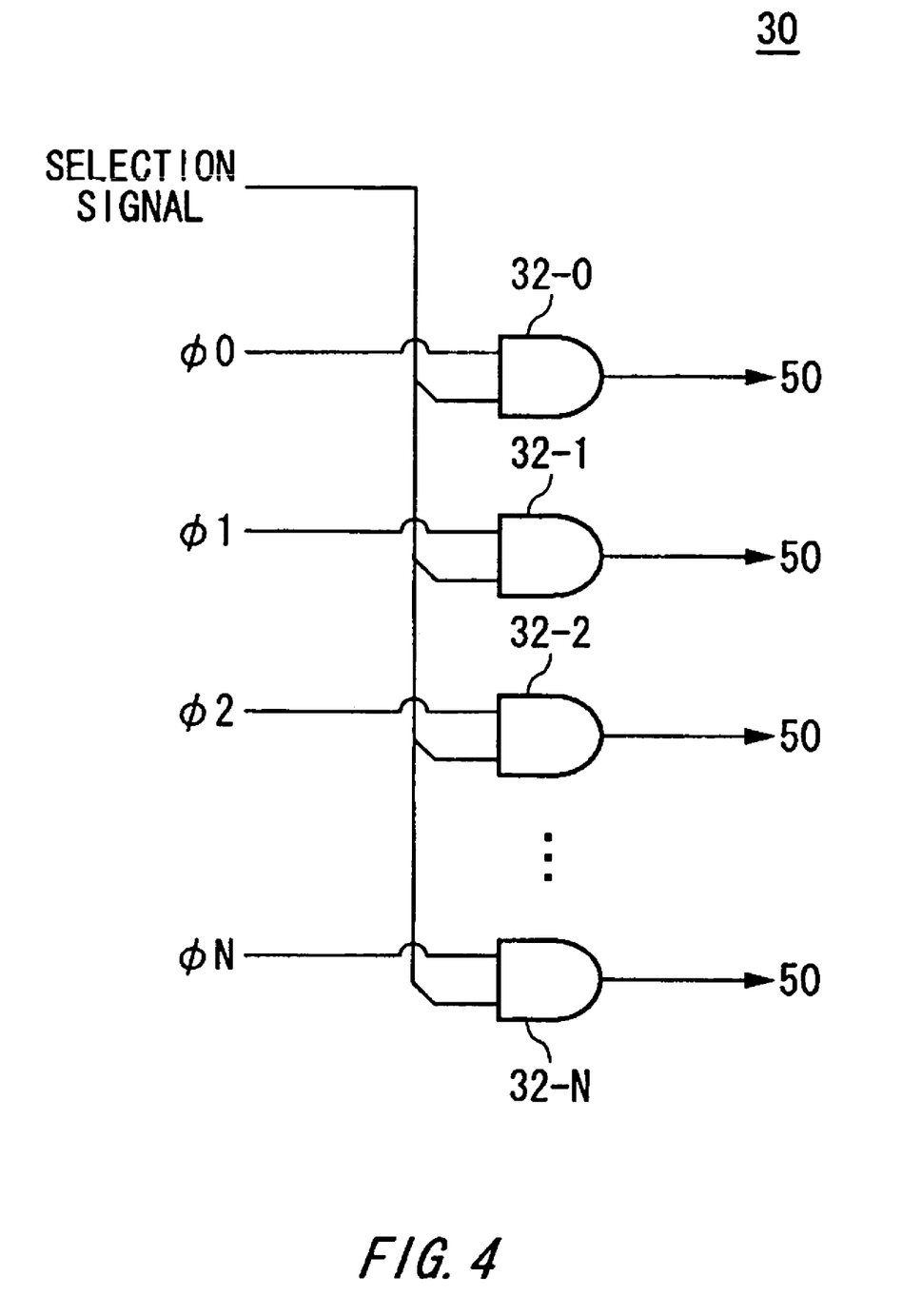
FIG. 4 is a diagram showing one exemplary configuration of a selecting section 30.

FIG. 4 is a diagram showing one exemplary configuration of the selecting section 30. In this example, the selecting section 30 has a plurality of AND circuits 32-0 through 32-N (denoted generally as 32 hereinafter). The respective AND circuits 32 are provided in correspondence to the plurality of first variable delay circuits 22 and receive the input signals inputted to the corresponding first variable delay circuits 22. Each AND circuit 32 also receives a selection signal and outputs AND of the selection signal and the input signal to the frequency adding circuit 50. That is, it is possible to control whether or not each input signal is to be supplied to the frequency adding circuit 50 by the selection signal.

Figure 5:
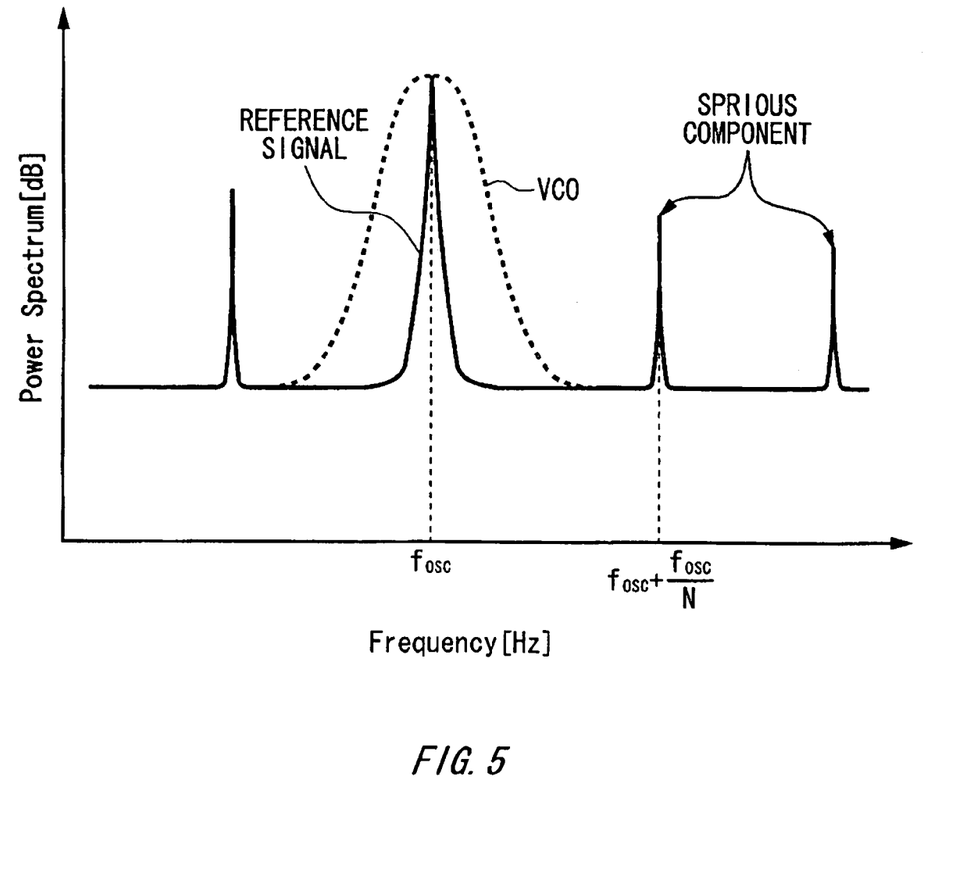
FIG. 5 is a graph showing one exemplary spectrum of an oscillating signal generated by the oscillator 100.

FIG. 5 is a graph showing one exemplary spectrum of the oscillating signal generated by the oscillator 100. In FIG. 5, an axis of abscissa represents frequency of the oscillating signal and an axis of ordinate represents intensity of spectrum in each frequency. As shown in FIG. 5, the oscillating signal has a spectrum having a Q-value almost equal to the reference signal at predetermined center frequency $f_{osc}$ and causes spurious components per $f_{osc}/n$ centering on the center frequency $f_{osc}$.

Because the Q-value at the center frequency $f_{osc}$ is almost equal to the Q-value of the reference signal generated by the quartz oscillator, the Q-value at the center frequency $f_{osc}$ may be improved as compared to a case of generating an oscillating signal by means of VCO. Still more, because the spurious components appear discretely at positions fully separated from the center frequency $f_{osc}$, the simple filter may readily remove them as described before. Therefore, the oscillator 100 can generate the oscillating signal from which noise has been reduced.

Figure 6:
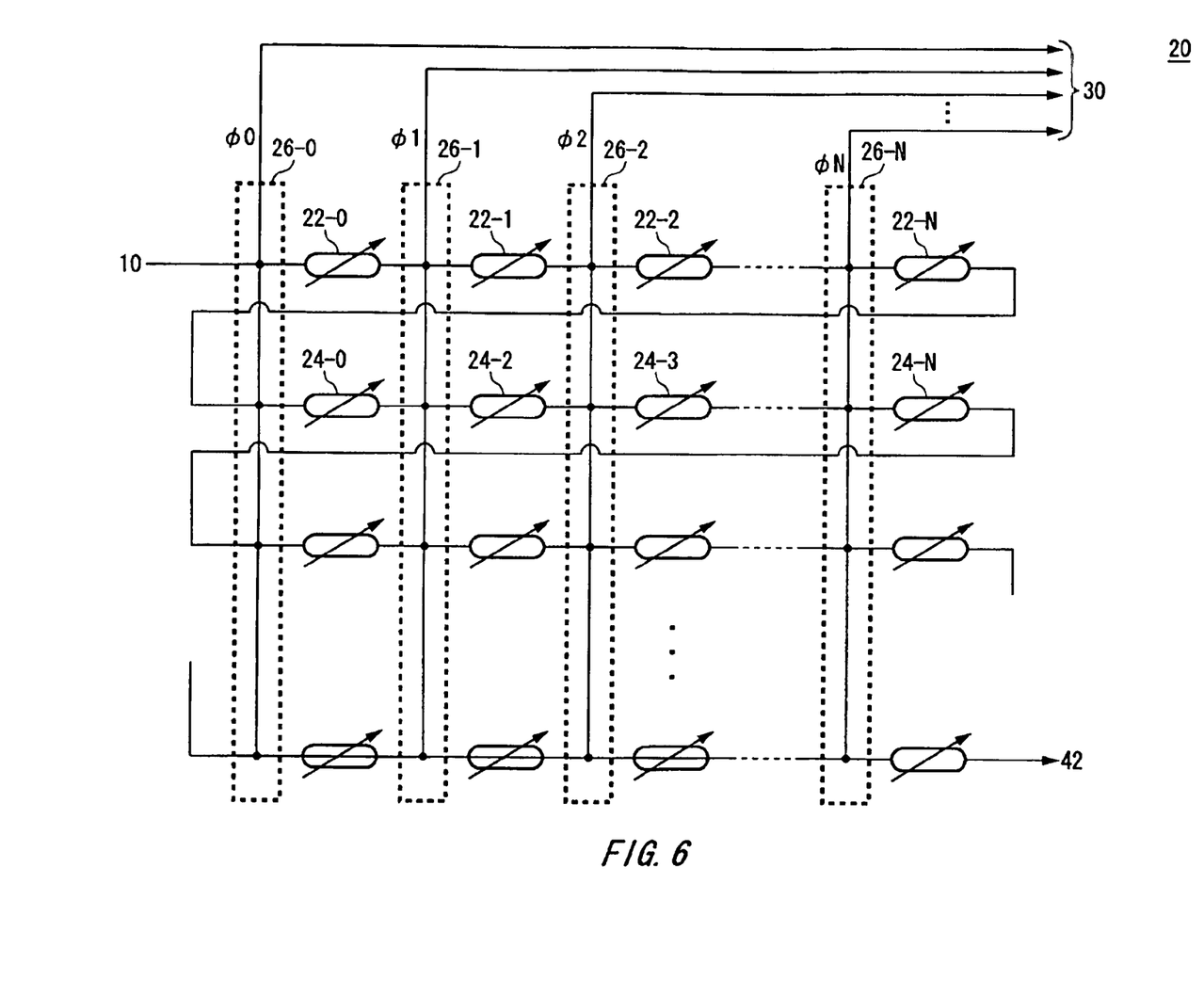
FIG. 6 is a diagram showing another exemplary configuration of a delaying section 20.

FIG. 6 is a diagram showing another exemplary configuration of the delaying section 20. The delaying section 20 of this example further includes a plurality of second variable delay circuits 24-0 through 24-N (denoted generally as 24 hereinafter) connected in cascade and a plurality of voltage adding circuits 26-0 through 26-N (denoted generally as 26 hereinafter) in addition to the structure of the delaying section 20 explained in connection with FIG. 1.

The plurality of second variable delay circuits 24 is connected with the same number of plurality of first variable delay circuits 22 in cascade and outputs the delay signal outputted out of the final stage of the plurality of first variable delay circuits 22 to the phase comparing section 42 by sequentially delaying by the almost same value of delay with that of the first variable delay circuits 22. Preferably, the plurality of first and second variable delay circuits 22 and 24 have the same characteristics. That is, preferably, they generate the same value of delay with respect to the same preset value of delay. Still more, preferably the delay control section 46 (see FIG. 1) sets the values of delay of the plurality of first and second variable delay circuits 22 and 24 at the same value.

Each of the voltage adding circuits 26 adds voltage level of the input signals inputted respectively to the first and second variable delay circuits 22 and 24 provided in the same stage in the plurality of first and second variable delay circuits 22 and 24 and supplies it to the frequency adding circuit. The voltage adding circuit 26 is provided per each stage of the plurality of first variable delay circuits 22 and the plurality of second variable delay circuits 24. Such configuration allows the skew of each input signal caused by dispersion of elements of the plurality of first variable delay circuits 22 to be averaged and reduced.

Each of the voltage adding circuits 26 may be configured so as to add voltage level of the respective input signals by connecting input terminals of the first and second variable delay circuits 22 and 24 provided in the same stage or may be configured so as to have a circuit for adding the voltage level of the respective input signals.

Still more, although the case when the delaying section 20 has the plurality of first and second variable delay circuits 22 and 24 has been explained above, the delaying section 20 may further include a plurality of variable delay circuits having the same configuration with the plurality of first variable delay circuits 22 as shown in FIG. 6. In this case, the voltage adding circuit 26 can reduce the skew of the input signal further by adding the voltage level of the input signals inputted to the respective variable delay circuits provided in the same stage.

Still more, because the oscillator 100 of this example generates the rising and falling edges of the oscillating signal respectively by the input signals, it can reduce jitter in the both edges of the rising and falling edges by reducing the skew of the input signals. That is, a duty ratio of the oscillating signal may be accurately controlled to 50%.

Figure 7:
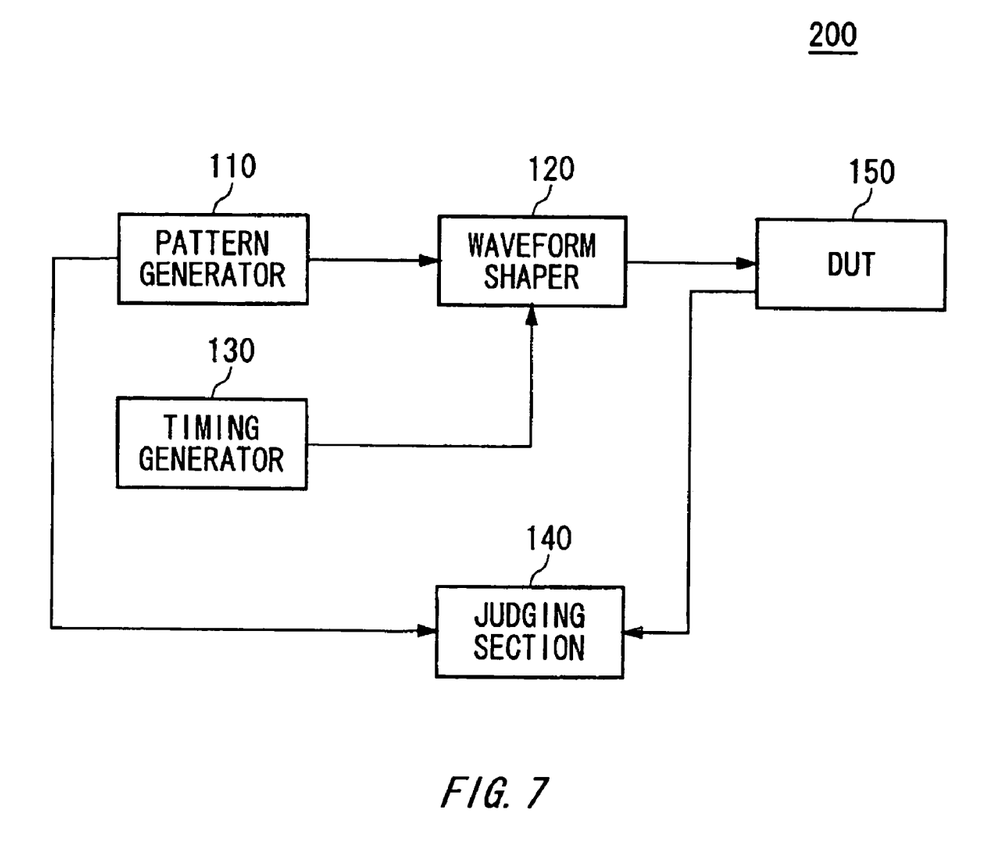
FIG. 7 is a diagram showing one exemplary configuration of a delaying section 200 for testing an electronic device 150.

FIG. 7 is a diagram showing one exemplary configuration of a test apparatus 200 for testing an electronic device 150. The test apparatus 200 has a pattern generator 110, a waveform shaper 120, a timing generator 130 and a judging section 140.

The pattern generator 110 generates a test pattern for testing the electronic device 150 and supplies it to the waveform shaper 120. The pattern generator 110 also generates a signal of expected value to be outputted out of the electronic device 150 corresponding to the test pattern and supplies it to the judging section 140.

The waveform shaper 120 shapes the test pattern and supplies it to the electronic device 150. The timing generator 130 generates a clock signal having desired frequency for controlling timing of the waveform shaper 120 in supplying the test pattern. Here, the timing generator 130 has the oscillator 100, explained in connection with FIGS. 1 through 6, for generating the clock signal. The test apparatus 200 may also have the oscillator 100 explained in connection with FIGS. 1 through 6 to generate reference clock for operating each component of the test apparatus 200.

The judging section 140 compares an output signal outputted out of the electronic device 150 with the expected value signal based on the test pattern to judge whether or not the electronic device 150 is defect-free. The test apparatus 200 of the present embodiment can carry out the test by using the clock having less noise, so that it can accurately judge whether or not the electronic device 150 is defect-free.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

As it is apparent from the above description, the invention allows the oscillating signal having less noise to be readily generated.

What is claimed is:

1. An oscillator for generating an oscillating signal having desired frequency, comprising:
    a reference oscillating section for generating a reference signal having predetermined frequency;
    a plurality of first variable delay circuits, connected in cascade, for receiving said reference signal and outputting said received reference signal by sequentially delaying by almost equal value of delay;
    a phase comparing section for comparing phase of said reference signal generated by said reference oscillating section with phase of a delay signal outputted out of a final stage of said plurality of first variable delay circuits;
    a delay control section for controlling a value of delay of said plurality of first variable delay circuits so that the phase of said reference signal becomes almost equal to the phase of the delay signal outputted out of the final stage of said plurality of first variable delay circuits; and
    a frequency adding circuit for generating said oscillating signal in which edges of said respective input signals are combined by logically operating the input signals inputted to said respective first variable delay circuits,
    wherein said oscillator generates said oscillating signal having frequency of k times (where k is an integer of 2 or more) of frequency of said reference signal; 2k of said first variable delay circuits are connected in cascade and are provided respectively with a value of delay almost equal to ½k times of period of said reference signal; and said frequency adding circuit generates rising and falling edges of said oscillating signal based on rising edges of said input signals inputted respectively to said plurality of first variable delay circuits,
    further comprising:
    a plurality of second variable delay circuits, connected in cascade, for receiving said delay signal outputted out of the final stage of said plurality of first variable delay circuits and outputting said received delay signal by sequentially delaying by almost equal values of delay with said first variable delay circuits; and
    a plurality of voltage adding circuits, provided per each stage of said plurality of first variable delay circuits and said plurality of second variable delay circuits, for adding voltage level of said input signals inputted respectively to said first variable delay circuits and said second variable delay circuits provided in the same stage in said plurality of first variable delay circuits and said plurality of second variable delay circuits and for supplying them to said frequency adding circuit.

2. The oscillator as set forth in claim 1, wherein said reference oscillating section is a quartz oscillator.

3. The oscillator as set forth in claim 1, further comprising a selecting section for selecting a plurality of input signals whose phase interval is almost equal among said plurality of input signals inputted to said plurality of first variable delay circuits and supplying said selected input signals to said frequency adding circuit to generate said oscillating signal having frequency corresponding to said phase interval.

4. The oscillator as set forth in claim 1, further comprising a selecting section for selecting said plurality of arbitrary input signals among said plurality of input signals outputted out of said plurality of first variable delay circuits and supplying said selected input signals to said frequency adding circuit to generate said oscillating signal having an arbitrary pattern.

5. The oscillator as set forth in claim 1, further comprising a filter for removing a spurious component caused by skew of said plurality of input signals from a frequency component of said oscillating signal generated by said frequency adding circuit.

6. The oscillator as set forth in claim 1, wherein said frequency adding circuit has:
    a plurality of H-level generating sections, provided in correspondence to said first variable delay circuits provided in even numbered stages among said plurality of first variable delay circuits, for generating portions presenting H level in a waveform of said oscillating signal; and
    a plurality of L-level generating sections, provided in correspondence to said first variable delay circuits provided in odd numbered stages among said plurality of first variable delay circuits, for generating portions presenting L level in the waveform of said oscillating signal,
    wherein each of said H-level generating sections operates AND of the input signal inputted to said corresponding first variable delay circuit and said input signal delayed from the input signal by a time in which a value of delay of a portion of said first variable delay circuit is added with a half period of said reference signal and outputs voltage of H level of said oscillating signal when the calculated AND presents logic H;
    each of said L-level generating section operates AND of the input signal inputted to said corresponding first variable delay circuit and said input signal delayed from the input signal by a time in which a value of delay of a portion of said first variable delay circuit is added with the half period of said reference signal and outputs voltage of L level of said oscillating signal when the calculated AND presents the logic H; and
    said frequency adding circuit outputs a sum of signals outputted out of said plurality of H-level generating sections and said plurality of L-level generating section as said oscillating signal.

7. An oscillator for generating an oscillating signal having desired frequency, comprising:
    a reference oscillating section for generating a reference signal having predetermined frequency;
    a plurality of first variable delay circuits, connected in cascade, for receiving said reference signal and outputting said received reference signal by sequentially delaying by almost equal value of delay;
    a phase comparing section for comparing phase of said reference signal generated by said reference oscillating section with phase of a delay signal outputted out of a final stage of said plurality of first variable delay circuits;
    a delay control section for controlling a value of delay of said plurality of first variable delay circuits so that the phase of said reference signal becomes almost equal to the phase of the delay signal outputted out of the final stage of said plurality of first variable delay circuits; and a frequency adding circuit for generating said oscillating signal in which edges of said respective input signals are combined by logically operating the input signals inputted to said respective first variable delay circuits, wherein said oscillator generates said oscillating signal having frequency of k times (where k is an integer of 2 or more) of frequency of said reference signal: 2k of said first variable delay circuits are connected in cascade and are provided respectively with a value of delay almost equal to ½k times of period of said reference signal; and said frequency adding circuit generates rising and falling edges of said oscillating signal based on rising edges of said input signals inputted respectively to said plurality of first variable delay circuits, wherein said frequency adding circuit has:

a plurality of H-level generating sections, provided in correspondence to said first variable delay circuits provided in even numbered stages among said plurality of first variable delay circuits, for generating portions presenting H level in a waveform of said oscillating signal; and a plurality of L-level generating sections, provided in correspondence to said first variable delay circuits provided in odd numbered stages among said plurality of first variable delay circuits, for generating portions presenting L level in the waveform of said oscillating signal;

wherein each of said H-level generating sections operates AND of the input signal inputted to said corresponding first variable delay circuit and said input signal delayed from the input signal by a time in which a value of delay of a portion of said first variable delay circuit is added with a half period of said reference signal and outputs voltage of H level of said oscillating signal when the calculated AND presents logic H;

each of said L-level generating section operates AND of the input signal inputted to said corresponding first variable delay circuit and said input signal delayed from the input signal by a time in which a value of delay of a portion of said first variable delay circuit is added with the half period of said reference signal and outputs voltage of L level of said oscillating signal when the calculated AND presents the logic H; and said frequency adding circuit outputs a sum of signals outputted out of said plurality of H-level generating sections and said plurality of L-level generating section as said oscillating signal.

8. The oscillator as set forth in claim 7, further comprising a selecting section for selecting a plurality of input signals whose phase interval is almost equal among said plurality of input signals inputted to said plurality of first variable delay circuits and supplying said selected input signals to said frequency adding circuit to generate said oscillating signal having frequency corresponding to said phase interval.

9. The oscillator as set forth in claim 7, further comprising a selecting section for selecting said plurality of arbitrary input signals among said plurality of input signals outputted out of said plurality of first variable delay circuits and supplying said selected input signals to said frequency adding circuit to generate said oscillating signal having an arbitrary pattern.

10. The oscillator as set forth in claim 7, further comprising a filter for removing a spurious component caused by skew of said plurality of input signals from a frequency component of said oscillating signal generated by said frequency adding circuit.

11. The oscillator as set forth in claim 7, further comprising:

a plurality of second variable delay circuits, connected in cascade, for receiving said delay signal outputted out of the final stage of said plurality of first variable delay circuits and outputting said received delay signal by sequentially delaying by almost equal values of delay with said first variable delay circuits; and a plurality of voltage adding circuits, provided per each stage of said plurality of first variable delay circuits and said plurality of second variable delay circuits, for adding voltage level of said input signals inputted respectively to said first variable delay circuits and said second variable delay circuits provided in the same stage in said plurality of first variable delay circuits and said plurality of second variable delay circuits and for supplying them to said frequency adding circuit.

12. The oscillator as set forth in claim 7, wherein said reference oscillating section is a quartz oscillator.

13. An oscillator for generating an oscillating signal having desired frequency, comprising:

a reference oscillating section for generating a reference signal having predetermined frequency;

a plurality of first variable delay circuits, connected in cascade, for receiving said reference signal and outputting said received reference signal by sequentially delaying by almost equal value of delay;

a phase comparing section for comparing phase of said reference signal generated by said reference oscillating section with phase of a delay signal outputted out of a final stage of said plurality of first variable delay circuits;

a delay control section for controlling a value of delay of said plurality of first variable delay circuits so that the phase of said reference signal becomes almost equal to the phase of the delay signal outputted out of the final stage of said plurality of first variable delay circuits; and a frequency adding circuit for generating said oscillating signal in which edges of said respective input signals are combined by logically operating the input signals inputted to said respective first variable delay circuits, wherein said frequency adding circuit generates rising and falling edges of said oscillating signal based on at least one of rising and falling edges of said input signals inputted respectively to said plurality of first variable delay circuits, wherein said frequency adding circuit has:

a plurality of H-level generating sections, provided in correspondence to said plurality of first variable delay circuits, for generating portions presenting H level in a waveform of said oscillating signal; and a plurality of L-level generating sections, provided in correspondence to said plurality of first variable delay circuits, for generating portions presenting L level in the waveform of said oscillating signal, wherein each of said H-level generating sections operates AND of each input signal inputted to said corresponding first variable delay circuits and outputs voltage of H level of said oscillating signal when the calculated AND presents logic H;

each of said L-level generating section operates AND of each input signal inputted to said corresponding first variable delay circuits and outputs voltage of L Level of said oscillating signal when the calculated AND presents the logic H; and said frequency adding circuit outputs a sum of signals outputted out of said plurality of H-level generating sections and said plurality of L-level generating section as said oscillating signal.

14. The oscillator as set forth in claim 13, further comprising a selecting section for selecting a plurality of input signals whose phase interval is almost equal among said plurality of input signals inputted to said plurality of first variable delay circuits and supplying said selected input signals to said frequency adding circuit to generate said oscillating signal having frequency corresponding to said phase interval.

15. The oscillator as set forth in claim 13, further comprising a selecting section for selecting said plurality of arbitrary input signals among said plurality of input signals outputted out of said plurality of first variable delay circuits and supplying said selected input signals to said frequency adding circuit to generate said oscillating signal having an arbitrary pattern.

16. The oscillator as set forth in claim 13, further comprising a filter for removing a spurious component caused by skew of said plurality of input signals from a frequency component of said oscillating signal generated by said frequency adding circuit.

17. The oscillator as set forth in claim 13, further comprising:
- a plurality of second variable delay circuits, connected in cascade, for receiving said delay signal outputted out of the final stage of said plurality of first variable delay circuits and outputting said received delay signal by sequentially delaying by almost equal values of delay with said first variable delay circuits; and
- a plurality of voltage adding circuits, provided per each stage of said plurality of first variable delay circuits and said plurality of second variable delay circuits, for adding voltage level of said input signals inputted respectively to said first variable delay circuits and said second variable delay circuits provided in the same stage in said plurality of first variable delay circuits and said plurality of second variable delay circuits and for supplying them to said frequency adding circuit.

18. The oscillator as set forth in claim 13, wherein the plurality of H-level generating sections are provided in correspondence to said first variable delay circuits provided in even numbered stages among said plurality of first variable delay circuits, and the plurality of L-level generating sections are provided in correspondence to said first variable delay circuits provided in odd numbered stages among said plurality of first variable delay circuits, and wherein each of said H-level generating sections operates AND and said input signal delayed from the input signal by a time in which a value of delay of a portion of said first variable delay circuit is added with a half period of said reference signal, and each of said L-level generating section operates AND and said input signal delayed from the input signal by a time in which a value of delay of a portion of said first variable delay circuit is added with the half period of said reference signal.

19. The oscillator as set forth in claim 13, wherein said reference oscillating section is a quartz oscillator.

20. A frequency multiplier for outputting an oscillating signal in which frequency of a given reference signal is multiplied, comprising:

- a plurality of first variable delay circuits connected in cascade for receiving said reference signal and outputting said received reference signal by sequentially delaying with almost equal values of delay;
- a phase comparing section for comparing phase of said reference signal generated by said reference oscillating section with phase of a delay signal outputted out of a final stage of said plurality of first variable delay circuits;
- a delay control section for controlling the value of delay of said plurality of first variable delay circuits so that the phase of said reference signal is almost equalized with the phase of the delay signal outputted out of the final stage of said plurality of first variable delay circuits; and
- a frequency adding circuit for generating said oscillating signal in which edges of said respective input signals are combined by logically operating the input signals inputted to said respective first variable delay circuits,
wherein said oscillator generates said oscillating signal having frequency of k times (where k is an integer of 2 or more) of frequency of said reference signal; 2k of said first variable delay circuits are connected in cascade and are provided respectively with a value of delay almost equal to ½k times of period of said reference signal; and said frequency adding circuit generates rising and falling edges of said oscillating signal based on rising edges of said input signals inputted respectively to said plurality of first variable delay circuits, further comprising:
a plurality of second variable delay circuits, connected in cascade, for receiving said delay signal outputted out of the final stage of said plurality of first variable delay circuits and outputting said received delay signal by sequentially delaying by almost equal values of delay with said first variable delay circuits; and
a plurality of voltage adding circuits, provided per each stage of said plurality of first variable delay circuits and said plurality of second variable delay circuits, for adding voltage level of said input signals inputted respectively to said first variable delay circuits and said second variable delay circuits provided in the same stage in said plurality of first variable delay circuits and said plurality of second variable delay circuits and for supplying them to said frequency adding circuit.

21. A frequency multiplier for outputting an oscillating signal in which frequency of a given reference signal is multiplied, comprising:
- a plurality of first variable delay circuits connected in cascade for receiving said reference signal and outputting said received reference signal by sequentially delaying with almost equal values of delay;
- a phase comparing section for comparing phase of said reference signal generated by said reference oscillating section with phase of a delay signal outputted out of a final stage of said plurality of first variable delay circuits;
- a delay control section for controlling the value of delay of said plurality of first variable delay circuits so that the phase of said reference signal is almost equalized with the phase of the delay signal outputted out of the final stage of said plurality of first variable delay circuits; and
- a frequency adding circuit for generating said oscillating signal in which edges of said respective input signals are combined by logically operating the input signals inputted to said respective first variable delay circuits, wherein said oscillator generates said oscillating signal having frequency of k times (where k is an integer of 2 or more) of frequency of said reference signal; 2k of said first variable delay circuits are connected in cascade and are provided respectively with a value of delay almost equal to ½k times of period of said reference signal; and said frequency adding circuit generates rising and falling edges of said oscillating signal based on rising edges of said input signals inputted respectively to said plurality of first variable delay circuits, wherein said frequency adding circuit has:

a plurality of H-level generating sections, provided in correspondence to said first variable delay circuits provided in even numbered stages among said plurality of first variable delay circuits, for generating portions presenting H level in a waveform of said oscillating signal; and a plurality of L-level generating sections, provided in correspondence to said first variable delay circuits provided in odd numbered stages among said plurality of first variable delay circuits, for generating portions presenting L level in the waveform of said oscillating signal;

wherein each of said H-level generating sections operates AND of the input signal inputted to said corresponding first variable delay circuit and said input signal delayed from the input signal by a time in which a value of delay of a portion of said first variable delay circuit is added with a half period of said reference signal and outputs voltage of H level of said oscillating signal when the calculated AND presents logic H;

each of said L-level generating section operates AND of the input signal inputted to said corresponding first variable delay circuit and said input signal delayed from the input signal by a time in which a value of delay of a portion of said first variable delay circuit is added with the half period of said reference signal and outputs voltage of L level of said oscillating signal when the calculated AND presents the logic H; and said frequency adding circuit outputs a sum of signals outputted out of said plurality of H-level generating sections and said plurality of L-level generating section as said oscillating signal.

22. A frequency multiplier for outputting an oscillating signal in which frequency of a given reference signal is multiplied, comprising:

a plurality of first variable delay circuits connected in cascade for receiving said reference signal and outputting said received reference signal by sequentially delaying with almost equal values of delay;

a phase comparing section for comparing phase of said reference signal generated by said reference oscillating section with phase of a delay signal outputted out of a final stage of said plurality of first variable delay circuits;

a delay control section for controlling the value of delay of said plurality of first variable delay circuits so that the phase of said reference signal is almost equalized with the phase of the delay signal outputted out of the final stage of said plurality of first variable delay circuits; and a frequency adding circuit for generating said oscillating signal in which edges of said respective input signals are combined by logically operating the input signals inputted to said respective first variable delay circuits, wherein said frequency adding circuit generates rising and falling edges of said oscillating signal based on at least one of rising and falling edges of said input signals inputted respectively to said plurality of first variable delay circuits, wherein said frequency adding circuit has:

a plurality of H-level generating sections, provided in correspondence to said plurality of first variable delay circuits, for generating portions presenting H level in a waveform of said oscillating signal; and a plurality of L-level generating sections, provided in correspondence to said plurality of first variable delay circuits, for generating portions presenting L level in the waveform of said oscillating signal, wherein each of said H-level generating sections operates AND of each input signal inputted to said corresponding first variable delay circuits and outputs voltage of H level of said oscillating signal when the calculated AND presents logic H;

each of said L-level generating section operates AND of each input signal inputted to said corresponding first variable delay circuits and outputs voltage of L level of said oscillating signal when the calculated AND presents the logic H; and said frequency adding circuit outputs a sum of signals outputted out of said plurality of H-level generating sections and said plurality of L-level generating section as said oscillating signal.

23. A test apparatus for testing an electronic device, comprising:

a pattern generator for generating a test pattern for testing said electronic device;

a waveform shaper for shaping and supplying said test pattern to said electronic device; a timing generator for generating a clock signal having desired frequency for controlling timing of said waveform shaper for supplying said test pattern; and a judging section for comparing an output signal outputted out of said electronic device with an expected value signal based on said test pattern to judge whether or not said electronic device is defect-free, wherein said timing generator comprises:

a reference oscillating section for generating a reference signal having predetermined frequency;

a plurality of first variable delay circuits connected in cascade for receiving said reference signal and outputting said received reference signal by sequentially delaying with almost equal values of delay;

a phase comparing section for comparing phase of said reference signal generated by said reference oscillating section with phase of a delay signal outputted out of a final stage of said plurality of first variable delay circuits;

a delay control section for controlling the value of delay of said plurality of first variable delay circuits so that the phase of said reference signal is almost equalized with the phase of the delay signal outputted out of the final stage of said plurality of first variable delay circuits; and a frequency adding circuit for generating said clock signal in which edges of said respective input signals are combined by logically operating the input signals inputted to said respective first variable delay circuits, wherein said oscillator generates said oscillating signal having frequency of k times (where k is an integer of 2 or more) of frequency of said reference signal; 2k of said first variable delay circuits are connected in cascade and are provided respectively with a value of delay almost equal to ½k times of period of said reference signal; and said frequency adding circuit generates rising and falling edges of said oscillating signal based on rising edges of said input signals inputted respectively to said plurality of first variable delay circuits, further comprising:

a plurality of second variable delay circuits, connected in cascade, for receiving said delay signal outputted out of the final stage of said plurality of first variable delay circuits and outputting said received delay signal by sequentially delaying by almost equal values of delay with said first variable delay circuits; and a plurality of voltage adding circuits, provided per each stage of said plurality of first variable delay circuits and said plurality of second variable delay circuits, for adding voltage level of said input signals inputted respectively to said first variable delay circuits and said second variable delay circuits provided in the same stage in said plurality of first variable delay circuits and said plurality of second variable delay circuits and for supplying them to said frequency adding circuit.

24. A test apparatus for testing an electronic device, comprising:

a pattern generator for generating a test pattern for testing said electronic device;

a waveform shaper for shaping and supplying said test pattern to said electronic device; a timing generator for generating a clock signal having desired frequency for controlling timing of said waveform shaper for supplying said test pattern; and a judging section for comparing an output signal outputted out of said electronic device with an expected value signal based on said test pattern to judge whether or not said electronic device is defect-free, wherein said timing generator comprises:

a reference oscillating section for generating a reference signal having predetermined frequency;

a plurality of first variable delay circuits connected in cascade for receiving said reference signal and outputting said received reference signal by sequentially delaying with almost equal values of delay;

a phase comparing section for comparing phase of said reference signal generated by said reference oscillating section with phase of a delay signal outputted out of a final stage of said plurality of first variable delay circuits;

a delay control section for controlling the value of delay of said plurality of first variable delay circuits so that the phase of said reference signal is almost equalized with the phase of the delay signal outputted out of the final stage of said plurality of first variable delay circuits; and a frequency adding circuit for generating said clock signal in which edges of said respective input signals are combined by logically operating the input signals inputted to said respective first variable delay circuits, wherein said oscillator generates said oscillating signal having frequency of k times (where k is an integer of 2 or more) of frequency of said reference signal; 2k of said first variable delay circuits are connected in cascade and are provided respectively with a value of delay almost equal to ½k times of period of said reference signal; and said frequency adding circuit generates rising and falling edges of said oscillating signal based on rising edges of said input signals inputted respectively to said plurality of first variable delay circuits, wherein said frequency adding circuit has:

a plurality of H-level generating sections, provided in correspondence to said first variable delay circuits provided in even numbered stages among said plurality of first variable delay circuits, for generating portions presenting H level in a waveform of said oscillating signal; and a plurality of L-level generating sections, provided in correspondence to said first variable delay circuits provided in odd numbered stages among said plurality of first variable delay circuits, for generating portions presenting L level in the waveform of said oscillating signal, wherein each of said H-level generating sections operates AND of the input signal inputted to said corresponding first variable delay circuit and said input signal delayed from the input signal by a time in which a value of delay of a portion of said first variable delay circuit is added with a half period of said reference signal and outputs voltage of H level of said oscillating signal when the calculated AND presents logic H;

each of said L-level generating section operates AND of the input signal inputted to said corresponding first variable delay circuit and said input signal delayed from the input signal by a time in which a value of delay of a portion of said first variable delay circuit is added with the half period of said reference signal and outputs voltage of L level of said oscillating signal when the calculated AND presents the logic H; and said frequency adding circuit outputs a sum of signals outputted out of said plurality of H-level generating sections and said plurality of L-level generating section as said oscillating signal.

25. A test apparatus for testing an electronic device, comprising:

a pattern generator for generating a test pattern for testing said electronic device;

a waveform shaper for shaping and supplying said test pattern to said electronic device; a timing generator for generating a clock signal having desired frequency for controlling timing of said waveform shaper for supplying said test pattern; and a judging section for comparing an output signal outputted out of said electronic device with an expected value signal based on said test pattern to judge whether or not said electronic device is defect-free, wherein said timing generator comprises:

a reference oscillating section for generating a reference signal having predetermined frequency;

a plurality of first variable delay circuits connected in cascade for receiving said reference signal and outputting said received reference signal by sequentially delaying with almost equal values of delay;

a phase comparing section for comparing phase of said reference signal generated by said reference oscillating section with phase of a delay signal outputted out of a final stage of said plurality of first variable delay circuits;

a delay control section for controlling the value of delay of said plurality of first variable delay circuits so that the phase of said reference signal is almost equalized with the phase of the delay signal outputted out of the final stage of said plurality of first variable delay circuits; and a frequency adding circuit for generating said clock signal in which edges of said respective input signals are combined by logically operating the input signals inputted to said respective first variable delay circuits, wherein said frequency adding circuit generates rising and falling edges of said oscillating signal based on at least one of rising and falling edges of said input signals inputted respectively to said plurality of first variable delay circuits, wherein said frequency adding circuit has:

a plurality of H-level generating sections, provided in correspondence to said plurality of first variable delay circuits, for generating portions presenting H level in a waveform of said oscillating signal; and a plurality of L-level generating sections, provided in correspondence to said plurality of first variable delay circuits, for generating portions presenting L level in the waveform of said oscillating signal, wherein each of said H-level generating sections operates AND of each input signal inputted to said corresponding first variable delay circuits and outputs voltage of H level of said oscillating signal when the calculated AND presents logic H;

each of said L-level generating section operates AND of each input signal inputted to said corresponding first variable delay circuits and outputs voltage of L level of said oscillating signal when the calculated AND presents the logic H; and said frequency adding circuit outputs a sum of signals outputted out of said plurality of H-level generating sections and said plurality of L-level generating section as said oscillating signal.

* * * * *